United States Patent
Lee et al.

(10) Patent No.: US 8,431,954 B2
(45) Date of Patent: *Apr. 30, 2013

(54) LIGHT EMITTING DEVICE EMPLOYING NON-STOICHIOMETRIC TETRAGONAL ALKALINE EARTH SILICATE PHOSPHORS

(75) Inventors: Chung Hoon Lee, Ansan-si (KR); Walter Tews, Greifswald (DE); Gundula Roth, Levenhagen (DE); Stefan Tews, Greifswald (DE)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/363,130

(22) Filed: Jan. 31, 2012

(65) Prior Publication Data

US 2012/0132939 A1 May 31, 2012

Related U.S. Application Data

(63) Continuation of application No. 12/440,001, filed as application No. PCT/KR2008/004734 on Aug. 14, 2008, now Pat. No. 8,134,165.

(30) Foreign Application Priority Data

Aug. 28, 2007 (KR) .................. 10-2007-0086483
Jul. 31, 2008 (KR) .................. 10-2008-0075181

(51) Int. Cl.
*H01L 33/00* (2010.01)

(52) U.S. Cl.
USPC ... 257/100; 257/89; 257/E33.061; 257/E27.12; 252/301.6 F; 252/301.4 F

(58) Field of Classification Search ............ 252/301.6 F, 252/301.4 F; 257/89, 100, E33.061, E27.12
See application file for complete search history.

(56) References Cited

U.S. PATENT DOCUMENTS

| 2,110,162 A | 3/1938 | Leverenz |
| 2,402,760 A | 6/1946 | Leverenz |

(Continued)

FOREIGN PATENT DOCUMENTS

| AT | 410266 | 3/2003 |
| CN | 1218084 | 6/1999 |

(Continued)

OTHER PUBLICATIONS

Joung Kyu Park et al., "Application of Strontium Silicate Yellow Phosphor for White Light-Emitting Diodes", Applied Physics Letters, vol. 84 No. 10, pp. 1647-1649, Mar. 8, 2004.

(Continued)

*Primary Examiner* — Matthew Reames
(74) *Attorney, Agent, or Firm* — H.C. Park & Associates, PLC

(57) ABSTRACT

Disclosed is a light emitting device employing non-stoichiometric tetragonal Alkaline Earth Silicate phosphors. The light emitting device comprises a light emitting diode emitting light of ultraviolet or visible light, and non-stoichiometric luminescent material disposed around the light emitting diode. The luminescent material adsorbs at least a portion of the light emitted from the light emitting diode and emits light having a different wavelength from the absorbed light. The non-stoichiometric luminescent material has tetragonal crystal structure, and contains more silicon in the crystal lattice than that in the crystal lattice of silicate phosphors having stoichiometric crystal structure. The luminescent material is represented as the formula $(Ba_u Sr_v Ca_w Cu_x)_{3-y}(Zn,Mg,Mn)_z Si_{1+b}O_{5+2b}:Eu_a$. Light emitting devices having improved temperature and humidity stability can be provided by employing the non-stoichiometric tetragonal Alkaline Earth Silicate phosphors.

20 Claims, 7 Drawing Sheets

U.S. PATENT DOCUMENTS

| | | | |
|---|---|---|---|
| 2,570,136 A | 10/1951 | Lyon |
| 2,617,773 A | 11/1952 | Nagy et al. |
| 2,719,128 A | 9/1955 | Kressin |
| 2,780,600 A | 2/1957 | Wollentin |
| 3,143,510 A | 8/1964 | Wanmaker et al. |
| 3,598,752 A | 8/1971 | Sisneros |
| 3,644,212 A | 2/1972 | McAllister et al. |
| 3,893,939 A | 7/1975 | De Kalb et al. |
| 3,905,911 A | 9/1975 | Kelsey, Jr. et al. |
| 4,215,289 A | 7/1980 | De Hair et al. |
| 4,770,950 A | 9/1988 | Ohnishi |
| 4,810,416 A | 3/1989 | Hase |
| 4,972,086 A | 11/1990 | Bryan et al. |
| 5,032,316 A | 7/1991 | Takahashi et al. |
| 5,188,763 A | 2/1993 | Chenot et al. |
| 5,433,295 A | 7/1995 | Murphy |
| 5,472,636 A | 12/1995 | Forster et al. |
| 5,518,808 A | 5/1996 | Bruno et al. |
| 5,770,110 A | 6/1998 | Schrell et al. |
| 5,770,111 A | 6/1998 | Moriyama et al. |
| 5,853,614 A | 12/1998 | Hao et al. |
| 5,952,681 A | 9/1999 | Chen |
| 5,965,192 A | 10/1999 | Potter |
| 5,998,925 A | 12/1999 | Shimizu et al. |
| 6,045,722 A | 4/2000 | Leblans et al. |
| 6,066,861 A | 5/2000 | Hohn et al. |
| 6,084,250 A | 7/2000 | Justel et al. |
| 6,373,184 B1 | 4/2002 | Suh et al. |
| 6,472,765 B1 | 10/2002 | Sano et al. |
| 6,482,664 B1 | 11/2002 | Lee et al. |
| 6,565,771 B1 | 5/2003 | Ono et al. |
| 6,670,751 B2 | 12/2003 | Song et al. |
| 6,686,691 B1 | 2/2004 | Mueller et al. |
| 6,842,664 B2 | 1/2005 | Harada et al. |
| 6,982,045 B2 | 1/2006 | Menkara et al. |
| 6,982,048 B1 | 1/2006 | Atwater et al. |
| 6,987,353 B2 | 1/2006 | Menkara et al. |
| 7,019,335 B2 | 3/2006 | Suenaga |
| 7,029,602 B2 | 4/2006 | Oshio |
| 7,045,078 B2 | 5/2006 | Choi |
| 7,138,770 B2 | 11/2006 | Uang et al. |
| 7,189,340 B2 | 3/2007 | Shimomura et al. |
| 7,201,858 B2 | 4/2007 | Shida et al. |
| 7,204,607 B2 | 4/2007 | Yano |
| 7,206,507 B2 | 4/2007 | Lee et al. |
| 7,229,571 B2 | 6/2007 | Ezuhara et al. |
| 7,244,965 B2 | 7/2007 | Andrews et al. |
| 7,332,746 B1 | 2/2008 | Takahashi et al. |
| 7,468,147 B2 | 12/2008 | Shida et al. |
| 7,554,129 B2 | 6/2009 | Roth et al. |
| 7,608,200 B2 | 10/2009 | Seto et al. |
| 7,679,101 B2 | 3/2010 | Ota et al. |
| 7,679,281 B2 | 3/2010 | Kim et al. |
| 8,066,909 B2 | 11/2011 | Roth et al. |
| 8,070,983 B2 | 12/2011 | Roth et al. |
| 8,070,984 B2 | 12/2011 | Roth et al. |
| 8,089,084 B2 | 1/2012 | Roth et al. |
| 8,134,165 B2 * | 3/2012 | Lee et al. ............ 257/89 |
| 8,137,589 B2 * | 3/2012 | Lee et al. ............ 252/301.6 R |
| 2002/0015013 A1 | 2/2002 | Ragle |
| 2003/0026096 A1 | 2/2003 | Ellens et al. |
| 2003/0030063 A1 | 2/2003 | Sosniak et al. |
| 2003/0038295 A1 | 2/2003 | Koda |
| 2003/0168636 A1 | 9/2003 | Dobson et al. |
| 2004/0051111 A1 | 3/2004 | Ota et al. |
| 2004/0079957 A1 | 4/2004 | Andrews et al. |
| 2004/0104391 A1 | 6/2004 | Maeda et al. |
| 2004/0135504 A1 | 7/2004 | Tamaki et al. |
| 2004/0136891 A1 | 7/2004 | Kijima et al. |
| 2004/0206970 A1 | 10/2004 | Martin |
| 2004/0251809 A1 | 12/2004 | Shimomura et al. |
| 2005/0001225 A1 | 1/2005 | Yoshimura et al. |
| 2005/0001537 A1 | 1/2005 | West et al. |
| 2005/0029927 A1 | 2/2005 | Setlur et al. |
| 2005/0117334 A1 | 6/2005 | Lee et al. |
| 2005/0139846 A1 | 6/2005 | Park et al. |
| 2005/0141048 A1 | 6/2005 | Mizutani |
| 2005/0239227 A1 | 10/2005 | Aanegola et al. |
| 2005/0264161 A1 | 12/2005 | Oaku et al. |
| 2005/0274930 A1 | 12/2005 | Roth et al. |
| 2005/0274972 A1 | 12/2005 | Roth et al. |
| 2006/0076883 A1 | 4/2006 | Himaki et al. |
| 2006/0086311 A1 | 4/2006 | Zagumennyi et al. |
| 2006/0158090 A1 | 7/2006 | Wang et al. |
| 2006/0261309 A1 | 11/2006 | Li et al. |
| 2006/0261350 A1 | 11/2006 | Kawazoe et al. |
| 2006/0267042 A1 | 11/2006 | Izuno et al. |
| 2007/0029526 A1 | 2/2007 | Cheng et al. |
| 2007/0247051 A1 | 10/2007 | Kuze et al. |
| 2007/0284563 A1 | 12/2007 | Lee et al. |
| 2008/0036364 A1 | 2/2008 | Li et al. |
| 2008/0067472 A1 | 3/2008 | Roth et al. |
| 2008/0067920 A1 | 3/2008 | Roth et al. |
| 2008/0224163 A1 | 9/2008 | Roth et al. |
| 2009/0050847 A1 | 2/2009 | Xu et al. |
| 2009/0050849 A1 | 2/2009 | Lee et al. |
| 2009/0134413 A1 | 5/2009 | Roth et al. |
| 2009/0152496 A1 | 6/2009 | Roth et al. |
| 2009/0262515 A1 | 10/2009 | Lee et al. |
| 2009/0303694 A1 | 12/2009 | Roth et al. |
| 2010/0002454 A1 | 1/2010 | Lee et al. |
| 2010/0165645 A1 | 7/2010 | Lee et al. |
| 2010/0207132 A1 | 8/2010 | Lee et al. |

FOREIGN PATENT DOCUMENTS

| | | |
|---|---|---|
| CN | 1289454 | 3/2001 |
| CN | 1317537 | 10/2001 |
| CN | 1344777 | 4/2002 |
| CN | 1434521 | 8/2003 |
| CN | 2624578 | 7/2004 |
| CN | 1581503 | 2/2005 |
| CN | 2690724 | 4/2005 |
| CN | 1702809 | 11/2005 |
| CN | 1706043 | 12/2005 |
| CN | 1707819 | 12/2005 |
| DE | 10233050 | 2/2004 |
| DE | 10259946 | 7/2004 |
| EP | 0094132 | 11/1983 |
| EP | 0382295 | 8/1993 |
| EP | 0862794 | 9/1998 |
| EP | 0896994 | 2/1999 |
| EP | 1249873 | 10/2002 |
| EP | 1605030 | 12/2005 |
| EP | 2031038 | 3/2009 |
| GB | 1336053 | 11/1973 |
| GB | 2016034 | 9/1979 |
| JP | 31-1118 | 2/1956 |
| JP | 33-8177 | 9/1958 |
| JP | 38-6082 | 5/1963 |
| JP | 39-8803 | 5/1964 |
| JP | 47-6258 | 4/1972 |
| JP | 49-38994 | 10/1974 |
| JP | 55-135190 | 10/1980 |
| JP | 57-109886 | 7/1982 |
| JP | 61-258892 | 11/1986 |
| JP | 62-197487 | 9/1987 |
| JP | 5-78659 | 3/1993 |
| JP | 9-40946 | 2/1997 |
| JP | 9-153644 | 6/1997 |
| JP | 9-279140 | 10/1997 |
| JP | 10-321914 | 12/1998 |
| JP | 11-177143 | 7/1999 |
| JP | 2000-260580 | 9/2000 |
| JP | 2000-294387 | 10/2000 |
| JP | 2001-308393 | 11/2001 |
| JP | 2001-524163 | 11/2001 |
| JP | 2002-50795 | 2/2002 |
| JP | 2002-057376 | 2/2002 |
| JP | 2002-094122 | 3/2002 |
| JP | 2002-97465 | 4/2002 |
| JP | 2002-97466 | 4/2002 |
| JP | 2002-173677 | 6/2002 |
| JP | 2002-531956 | 9/2002 |
| JP | 2002-335019 | 11/2002 |
| JP | 2002-359403 | 12/2002 |
| JP | 2002-368277 | 12/2002 |
| JP | 2003-064358 | 3/2003 |

| | | |
|---|---|---|
| JP | 2003-133595 | 5/2003 |
| JP | 2003-152229 | 5/2003 |
| JP | 2003-183649 | 7/2003 |
| JP | 2003-224306 | 8/2003 |
| JP | 2003-321675 | 11/2003 |
| JP | 2004-006582 | 1/2004 |
| JP | 2004-010786 | 1/2004 |
| JP | 2004-505470 | 2/2004 |
| JP | 2004-071726 | 3/2004 |
| JP | 2004-71807 | 3/2004 |
| JP | 2004-079867 | 3/2004 |
| JP | 2004-88011 | 3/2004 |
| JP | 2004-127988 | 4/2004 |
| JP | 2004-134699 | 4/2004 |
| JP | 2004-192833 | 7/2004 |
| JP | 2001-115157 | 12/2004 |
| JP | 2005-100799 | 4/2005 |
| JP | 2005-100800 | 4/2005 |
| JP | 2005-101296 | 4/2005 |
| JP | 2005-153606 | 6/2005 |
| JP | 2005-167177 | 6/2005 |
| JP | 2005-354027 | 12/2005 |
| JP | 2006-503431 | 1/2006 |
| JP | 2006-073656 | 3/2006 |
| JP | 2006-173433 | 6/2006 |
| JP | 2006-252944 | 9/2006 |
| JP | 2007-186674 | 7/2007 |
| JP | 2009-007545 | 1/2009 |
| KR | 10-232395 | 12/1999 |
| KR | 10-2001-0032450 | 4/2001 |
| KR | 10-2001-0050839 | 6/2001 |
| KR | 10-2001-0101910 | 11/2001 |
| KR | 10-2002-0000835 | 1/2002 |
| KR | 10-2002-0053975 | 7/2002 |
| KR | 10-0392363 | 7/2002 |
| KR | 10-2002-0079513 | 10/2002 |
| KR | 10-2003-0063211 | 7/2003 |
| KR | 10-2003-0082395 | 10/2003 |
| KR | 10-0426034 | 7/2004 |
| KR | 10-2004-0088418 | 10/2004 |
| KR | 10-2005-0008426 | 1/2005 |
| KR | 10-2005-0070349 | 7/2005 |
| KR | 10-2005-0098462 | 10/2005 |
| KR | 10-2005-0106945 | 11/2005 |
| KR | 10-2005-0117164 | 12/2005 |
| KR | 10-2006-0034056 | 4/2006 |
| KR | 10-0626272 | 9/2006 |
| KR | 10-2006-0117165 | 11/2006 |
| KR | 10-2006-0134728 | 12/2006 |
| KR | 10-2007-0016900 | 2/2007 |
| KR | 10-2007-0050833 | 5/2007 |
| KR | 10-2007-0084659 | 8/2007 |
| KR | 10-2007-0086483 | 8/2007 |
| KR | 10-2008-0046789 | 5/2008 |
| KR | 10-2008-0074241 | 7/2008 |
| KR | 10-2008-0075181 | 7/2008 |
| TW | I328885 | 3/1999 |
| TW | 546854 | 8/2003 |
| WO | 96-32457 | 10/1996 |
| WO | 98-05078 | 2/1998 |
| WO | 98-12757 | 3/1998 |
| WO | 98-39805 | 9/1998 |
| WO | 98-42798 | 10/1998 |
| WO | 00-19546 | 4/2000 |
| WO | 00/33390 | 6/2000 |
| WO | 01-41215 | 6/2001 |
| WO | 02-054502 | 7/2002 |
| WO | 02-054503 | 7/2002 |
| WO | 02-089219 | 11/2002 |
| WO | 03-021691 | 3/2003 |
| WO | 03/030274 | 4/2003 |
| WO | 2004/036962 | 4/2004 |
| WO | 2004-085570 | 10/2004 |
| WO | 2004100275 | 11/2004 |
| WO | 2004-111156 | 12/2004 |
| WO | 2005-068584 | 7/2005 |
| WO | 2005-112137 | 11/2005 |
| WO | 2005109532 | 11/2005 |
| WO | 2006-043682 | 4/2006 |
| WO | 2006-068359 | 6/2006 |
| WO | 2006-081803 | 8/2006 |
| WO | 2006/109659 | 10/2006 |
| WO | 2007/018569 | 2/2007 |
| WO | 2007-035026 | 3/2007 |
| WO | 2007/055538 | 5/2007 |
| WO | 2007-055538 | 5/2007 |
| WO | 2007055538 | 5/2007 |
| WO | 2007-069869 | 6/2007 |
| WO | 2007/069869 | 6/2007 |
| WO | 2007-114614 | 11/2007 |
| WO | 2009028818 | 3/2009 |

OTHER PUBLICATIONS

International Search Report for PCT/KR2010/003302 issued on Jan. 3, 2011, corresponding to U.S. Appl. No. 12/767,253.
Final Office Action dated Dec. 8, 2010 in U.S. Appl. No. 11/948,813.
Final Office Action dated Dec. 23, 2010 in U.S. Appl. No. 11/569,060.
Non Final Office Action dated Dec. 29, 2010 in U.S. Appl. No. 12/731,811.
Final Office Action dated Dec. 7, 2010 in U.S. Appl. No. 11/948,845.
Non Final Office Action dated Nov. 26, 2010 in U.S. Appl. No. 12/440,001.
Non Final Office Action dated Nov. 24, 2010 in U.S. Appl. No. 12/093,441.
Final Office Action dated Nov. 30, 2010 in U.S. Appl. No. 11/024,722.
Non Final Office Action dated Nov. 30, 2010 in U.S. Appl. No. 12/196,923.
Notice of Allowance dated Aug. 18, 2010 in U.S. Appl. No. 12/098,263.
Final Office Action dated May 11, 2010 in U.S. Appl. No. 12/098,263.
Non Final Office Action dated Mar. 17, 2010 in U.S. Appl. No. 11/024,722.
Non Final Office Action dated Aug. 17, 2010 in U.S. Appl. No. 11/948,845.
EP Search Report dated Sep. 1, 2010 in EP Appl No. 08015119 corresonding to U.S. Appl. No. 12/440,001.
EP Search Report dated Oct. 6, 2010 in EP Appl No. 07745750.5—corresponding to U.S. Appl. No. 12/295,438.
Non Final Office Action dated Jun. 16, 2010 in U.S. Appl. No. 12/097,741.
Final Office Action dated Nov. 12, 2010 in U.S. Appl. No. 12/097,741.
Non-Final Office Action dated Aug. 10, 2010 in U.S. Appl. No. 11/024,722.
Final Office Action dated Jun. 21, 2010 in U.S. Appl. No. 11/569,060.
Non-Final Office Action dated Apr. 30, 2010 in U.S. Appl. No. 11/568,769.
Final Office Action dated Sep. 9, 2010 in U.S. Appl. No. 11/568,769.
CN Office Action dated Feb. 5, 2010 in CN Appl. No. 2005100023042.
European Search Report of Oct. 26, 2010 in EP 10 17 7817, corresponding to U.S. Appl. No. 11/024,722.
Non-Final Office Action dated Aug. 18, 2010 in U.S. Appl. No. 11/948,813.
Non-Final Office Action dated Aug. 10, 2010 in U.S. Appl. No. 12/731,811.
IP Australia Office Action dated Jul. 2, 2010 for AU Patent Appl. No. 2005-319965, corresponding to U.S. Appl. No. 12/098,263.
TW Office Action of Sep. 10, 2010 in TW Patent Appl. No. 098123458.
European Search Report of Sep. 23, 2010 in European Patent Appl. No. 10 16 4970.
Non-final office action dated May 29, 2009 issued in U.S. Appl. No. 11/024,722, filed Dec. 30, 2004.
Notice of Allowance dated May 4, 2009 issued in U.S. Appl. No. 11/024,702.
Non-final office action dated Nov. 29, 2007 issued in U.S. Appl. No. 11/024,702, filed Dec. 30, 2004.

Non-final office action dated Aug. 12, 2009 issued in U.S. Appl. No. 11/569,060, filed Jun. 22, 2007.
Non-final office action dated Jan. 13, 2010 issued in U.S. Appl. No. 11/569,060, filed Jun. 22, 2007.
Non-final office action dated Nov. 17, 2009 issued in U.S. Appl. No. 12/097,741, filed Oct. 9, 2008.
Bogner et al., DE 102 33 050 A1, Feb. 5, 2004, Machine Traslation.
Final office action dated Feb. 7, 2007 issued in U.S. Appl. No. 11/024,702, filed Dec. 30, 2004.
Non-final office action dated Jun. 22, 2006 issued in U.S. Appl. No. 11/024,702, filed Dec. 30, 2004.
Non-final office action dated Nov. 29, 2006 issued in U.S. Appl. No. 11/024,722, filed Dec. 30, 2004.
Final office action dated Oct. 28, 2009 issued in U.S. Appl. No. 11/024,722, filed Dec. 30, 2004.
Non-final office action dated May 23, 2007 issued in U.S. Appl. No. 11/024,722, filed Dec. 30, 2004.
Non-final office action dated Nov. 14, 2008 issued in U.S. Appl. No. 11/024,722, filed Dec. 30, 2004.
Non-final office action dated Nov. 2, 2009 issued in U.S. Appl. No. 12/098,263.
Ralchenko, Yu., Kramida, A.E., Reader, J. and NIST ASD Team (2008). NIST Atomic Spectra Database (version 3.1.5), [Online]. Available: http://physics.nist.gov/asd3 [Feb. 27, 2009]. National Institute of Standards and Technology, Gaithersburg, MD.
N. S. Akhmetov, "Inorganic Chemistry", Moscow "Vysshaya Shkola", 1975; (partial translation; translated pp. 332-333, 372-373, 384-385, 427, 432, 436, 445, 471, 476, 486, 491, 496-497, 501, 546-549).
Markovsky L, Ya. et al., Phosphors (Moscow—Leningrad, KHIMIYA Publishers, 1966, p. 7 (partial translation).
Search Report dated Apr. 11, 2006 for EP Application No. EP04106880.0.
Search Report dated Nov. 5, 2008 for EP Application No. EP06812549.1.
Search Report dated Aug. 21, 2007 for EP Application No. EP04106882.6.
International Search Report for PCT/KR2010/003285 issued on Jan. 24, 2011, corresponding to U.S. Appl. No. 12/773,514.
Feldmann C., "Inorganic Luminescent Materials: 100 Years of Research and Application", Adv. Funct. Matter, 2003, pp. 511-516.
G. Blasse, B.C. Grabmeier, "Luminescent Materials", Springer, 1994, 87-90.
B. Cordero, V. Gómez, A. E. Platero-Prats, M. Revés, J. Echeverria, E. Cremades, F. Barragán, and S. Alvarez, "Covalent radii revisted", Dalton Trans., (2008), pp. 2832-2838.
R.J. Angel et al., "Structure and twinning of single-crystal MgSiO3 garnet synthisized at 17 GPa and 1800° C", American Minerologist, 74 (1989) pp. 509-512.
G.L. Miessler, D.A. Tarr, "Inorganic Chemistry", 3rd ed., Pearson / Prentice Hall, pp. 117-118 date unknown.
P.A. Cox, "Transition Metal Oxides", Oxford University Press, 1995, p. 105.
Garcia Solé, L.E. Bausá, D. Jaque, "An Introduction to the Optical Spectroscopy of Inorganic Solids", Wiley, 2005, pp. 163-164.
G. Blasse, B.C. Grabmeier, "Luminescent Materials", Springer, 1994, p. 25.
S. Shionoya, W.M. Yen, "Phospher Handbook" CRC press, 1999, ch. 3.3, pp. 183-184.
Garcia Solé, L.E. Bausá, D. Jaque, "An Introduction to the Optical Spectroscopy of Inorganic Solids", Wiley, 2005, pp. 132-133.
S. Shionoya, W.M. Yen, "Phosphor Handbook" CRC press, 1999, ch. 3.3, pp. 179-182.
Notice of Allowance of U.S. Appl. No. 12/440,001 dated on Nov. 7, 2011.
G. Blasse, A. Bril, "Characteristic Luminescence", Philips Technical Review, 31 (1970) 304, p. 306.
G. Blasse, B.C. Grabmeier, "Luminescent Materials", Springer, 1994, pp. 40-47.
R. Chen "Developments in Luminescence and Display Materials Over the Last 100 Years as Reflected in Electrochemical Society Publications", pp. 69-78, 2002.
Non-Final Office Action of U.S. Appl. No. 11/568,769 issued on Feb. 16, 2011.
Non-Final Office Action of U.S. Appl. No. 13/004,554 issued on Mar. 15, 2011.
Notice of Allowance of U.S. Appl. No. 11/024,722 issued on Mar. 10, 2011.
Final Office Action of U.S. Appl. No. 12/196,923 issued on Mar. 4, 2011.
Notice of Allowance of U.S. Appl. No. 11/948,845 issued on Mar. 23, 2011.
Non-Final Office Action of U.S. Appl. No. 12/098,263 issued on Mar. 30, 2011.
Indian Office Action of Indian Application No. 2468/KOLNP/2007 issued on Jan. 28, 2011, corresponding to U.S. Appl. No. 12/098,263.
Non-Final Office Action of U.S. Appl. No. 12/854,001 issued on Apr. 6, 2011.
Non-Final Office Action of U.S. Appl. No. 12/440,001 issued on Apr. 27, 2011.
Chinese Office Action of Chinese Patent Application No. 200880105091.8 issued on Apr. 1, 2011.
Chinese Office Action of Chinese Patent Application No. 201010198537.5 issued on Mar. 18, 2011.
Chinese Office Action of Chinese Patent Application No. 201010185274.4 issued on Mar. 2, 2011.
Austrian Office Action for AT Application No. 9514/2005 issued on Jun. 1, 2011.
Austrian Office Action for AT Application No. 1545/2010-1 issued on May 31, 2011.
Final Office Action of U.S. Appl. No. 12/731,811 issued on Jul. 29, 2011.
Notice of Allowance of U.S. Appl. No. 11/948,813 issued on Aug. 22, 2011.
Final Office Action of U.S. Appl. No. 12/854,001 issued on Oct. 11, 2011.
Notice of Allowance of U.S. Appl. No. 12/098,263 issued on Oct. 11, 2011.
Non-Final Office Action of U.S. Appl. No. 12/491,780 dated on Dec. 7, 2011.
Notice of Allowance of U.S. Appl. No. 12/196,923 issued on Nov. 10, 2011.
Notice of Allowance of U.S. Appl. No. 13/004,554 mailed on Dec. 13, 2011.
Final Office Action of U.S. Appl. No. 13/099,879 issued on Jan. 11, 2012.
Non-Final Office Action of U.S. Appl. No. 12/295,438 dated on Jan. 12, 2012.
Mark H. Garrett "Properties of photorefractive nonstoichiometric bismuth silicon oxide, BixSio1.5x+2" Center for Material Science and Engineering, Crystal Physics Lab., Massachusetts Institute of Technology, Cambridge, Massachusetts vol. 8, No. 1 Jan. 1991. p. 78-87.
Mesquita, et al. "Preparation and Cathodoluminescence of Ce 3+-activated Yttrium Silicates and some Isostructural Compounds" No1.4, No. 9 p. 643-650 1969 Pergamon Press, Inc in US.
EP Search Report of EP 11 18 4708 dated Nov. 11, 2011.
Declaration under CFR 1.132 of U.S. Appl. No. 11/024,722 dated Aug. 24, 2007.
Tomas L. Barry "Equilibria and Eu2+ luminescence of subsolidus phases bounded by Ba3MgSi2O8, Sr3MgSi2O8 and Ca3MgSi2O8" pp. 733-738 vol. 115, No. 7 J. Electrochem Soc.: Solid State Sceince Jul. 1968.
EP Search Report for EP 05 74 0758 issued on Jul. 26, 2011 correspond to U.S. Appl. No. 11/568,769.
EP Search Report for EP 05 74 0759 issued on Jul. 26, 2011 correspond to U.S. Appl. No. 11/569,060.
International Search Report dated Jul. 12, 2007 for PCT Application No. PCT/KR2007/001587.
International Search Report dated Mar. 21, 2007 for PCT Application No. PCT/KR2006/005500.
International Search Report dated Feb. 20, 2007 for PCT Application No. PCT/KR2006/004716.
International Search Report dated Oct. 24, 2005 for PCT Application No. PCT/KR2005/002332.

International Search Report dated Oct. 13, 2005 for PCT Application No. PCT/KR2005/002333.
International Search Report dated Aug. 12, 2005 for PCT Application No. PCT/KR2005/001288.
International Search Report dated Aug. 12, 2005 for PCT Application No. PCT/KR2005/001287.
International Search Report dated Feb. 27, 2009 for PCT Application No. PCT/KR2008/004734.
International Search Report dated Feb. 11, 2009 for PCT Application No. PCT/KR2008/004733.
Joung Kyu Park, et al., "Silicate Phosphors for White LEDs Identified Through Combinatorial Chemistry", Electrochemical and Solid-State Letters, vol. 10(2), pp. J15-J18, (2007), XP-00251106706-11-12).
Joung Kyu Park, et al., "Luminescence Characteristics of Yellow Emitting Ba3SiO5:EU2+ Phosphor", Journal of Materials Science 40 (2005), pp. 2069-2071, XP-002511068.
Search Report dated Feb. 2, 2009 for EP Application No. EP08014684.
S.D. Jee, et al., "Photoluminescence properties of Eu2+ -activated Sr3SiO5 Phosphors," J. Mater Sci. 41 (2006), pp. 3139-3141.
G. Blasse, et al., "Fluorescence of Europium2+-activated silicates," Philips Res. Repts 23 (1968), pp. 189-199.
G. Roth, et al. "Advanced Silicate Phosphors for improved white LED", Global Phosphor Summit Seoul/Korea, Mar. 5-7, 2007.
N.A. Toropov, et al "Inorganic and Analytical Chemistry—a Study of the Formation of Solid Solutions of Tristrontium Silicate . . . " published by Institute of Silicate Chemistry, Academy of Sciences of the USSR. pp. 1918-1921, submitted Aug. 21, 1962.
H.G. Kang, et al., "Embodiment and Luminescence Properties of Sr3SiO5:Eu(yellow-orange phosphor) by co-doping lanthanide", Solid State Phenomena, vol. 124-126 (2007) pp. 511-514.
T.L. Barry, "Fluorescence of Eu2+ Activated Phases in Binary Alkaline Earth Orthosilicate Systems", J. Electrochem Soc., Nov. 1968, pp. 1181-1184.
Notice of Allowance dated Dec. 1, 2008 issued in U.S. Appl. No. 11/024,702.
Chinese Office Action corresponding to Patent App No. 2005800150173 dated Dec. 28, 2007.
Final OA dated Oct. 22, 2007 issued in U.S. Appl. No. 11/024,722.
Office Action dated Dec. 28, 2007 corresponding to China App No. 200580016844.4.
X.W. Sun et al., "Pulsed Laser Deposition of Silicate Phosphor Thin Films", Appl. Phys. A 69, 1999, 5 pp.
W.L. Wanmaker et al. "Luminescence of Phosphors Based on the Host Lattice ABGe2O6 (A, B=Ca, Sr, Ba)" Journal of Solid State Chemistry 3, (1971), pp. 194-196.
Non-Final Office Action of U.S. Appl. No. 12/491,457 mailed on Nov. 17, 2011.
Non-Final OA mailed May 23, 2007 for U.S. Appl. No. 11/024,722 entitled "Luminescent Material".
Ageeth A. Bol et al., "Luminescence of ZnS:Cu2+", Journal of Luminescence, No. 99, 2002, pp. 325-334.
J.F. Suyver et al., "Luminescence of nanocrystalline ZnSe:Cu", Applied Physics Letters, vol. 79, No. 25, Dec. 17, 2001, pp. 4222-4224.
Ping Yang et al., "Photoluminescence of Cu+-doped and Cu2+-doped ZnS nanocrystallites", Journal of Physics and Chemistry of Solids, No. 63, 2002, pp. 638-643.

S. Shionoya et al., (Eds.), "Principal phosphor materials and their optical properties" in Phosphor Handbook, CRC Press, 1999, pp. 231-255.
A. Scacco et al., "Optical Spectra of Cu2+ Ions in LiF Crystals", Radiation Effects and Defects in Solids, vol. 134, 1995, pp. 333-336.
Lujcan Dubicki et al., "The First d-d Fluorescence of a Six-Coordinate Copper (II) Ion", J. Am. Chem. Soc. 1989, No. 111, pp. 3452, 3454.
A.B.P. Lever, "Inorganic Electronic Spectroscopy", 2nd ed., Elsevier, 1984, pp. 355 and 557-559.
A.G. Shenstone, "The Third Spectrum of Copper (Cu III)", Journal of Research of the National Bureau of Standards—A. Physics and Chemistry, vol. 79A, No. 3, May-Jun. 1975, pp. 497-521.
S. Shinoya et al. (Eds.), "Principal phosphor materials and their optical properties" in Phosphor Handbook, CRC Press, 1999, p. 826.
First Office Action of the PRC to Chinese Patent App No. 20051002304.2 dated Feb. 15, 2008.
Yang, "Up-Conversion Fluorescence in Er3 + Yb3 + Co- Doped Oxy-Fluoride Compound Materials Based on GeO2", Natural Science Journal of Xiangtan University, vol. 23, No. 2, 2001, pp. 37-41.
Bernhardt, Investigations of the Orange Luminescence of PbMoO4 Crystals, Phys. Stat. Sol (a), 91, 643, 1985, pp. 643-647.
Butler, "Fluorescent Lamp Phosphors", The Pennsylvania State University Press, 1980, pp. 175-176.
Butler, "Fluorescent Lamp Phosphors", The Pennsylvania State University Press, 1980, pp. 181-182.
Wanmaker, Luminescence of Copper-Activated Orthophosphates of the Type ABPO (A=Ca, Sr, or Ba and B=Li, Na or K), Journal of the Electrochemical Society, pp. 109-113.
Butler, "Fluorescent Lamp Phosphors", The Pennsylvania State University Press, 1980, pp. 281-284.
"Phosphors for Mercury Lamps" https:/www.lamptech.co.uk/Docuemnts/M14%20Phosphors.htm 2003 (2 pages).
Blasse, "Radiationless Processes in Luminescent Materials", Radiationless Processes, 1980, pp. 287-289, 293.
Shinonoya, "Phosphor Handbook", edited under the auspice of Phosphor Research Society, CRC Press, 1999, pp. 204-205.
Shinonoya, "Phosphor Handbook", edited under the auspice of Phosphor Research Society, CRC Press, 1998, p. 238-239, 241.
Wanmaker, "Luminescence of Copper-Activated Calcium and Strontium Orthophosphates", Journal of the Electromagnetic Society, pp. 1027-1031, 1959.
van Gool, "Philips Res. Rept. Suppl." 3, 1, 1961, pp. 1-9, 30-51, 84-85.
Declaration Under Rule 37 CFR 1.132 of Ulrich Kynast dated Sep. 6, 2008.
G. Blasse, "Characteristic Luminescence", Philips Technical Review, vol. 31, 1970, pp. 304-332.
Non-Final Office Action of U.S. Appl. No. 13/363,115 dated May 8, 2012.
Wanmaker, "Luminescence of Copper-Activated Calcium and Strontium Orthophosphates", Journal of the Electromagnetic Society, pp. 1027-1031, vol. 109, No. 2; 1962.
G.L. Miessler, D.A. Tarr, "Inorganic Chemistry", 3rd ed., Pearson / Prentice Hall, pp. 117-118, 2004.
Non-Final Office Action of U.S. Appl. No. 13/363,115 dated Oct. 25, 2012.

* cited by examiner

LIGHT EMITTING DEVICE EMPLOYING NON-STOICHIOMETRIC TETRAGONAL ALKALINE EARTH SILICATE PHOSPHORS

CROSS REFERENCE TO RELATED APPLICATIONS

This application is a continuation of U.S. patent application Ser. No. 12/440,001 filed on Mar. 4, 2009, now issued as U.S. Pat. No. 8,134,165, which is the National Stage Entry of International Application No. PCT/KR2008/004734, filed on Aug. 14, 2008, and claims priority from and the benefit of Korean Patent Application No. 10-2007-0086483, filed on Aug. 28, 2007, and Korean Patent Application No. 10-2008-0075181, filed on Jul. 31, 2008, which are all hereby incorporated by reference for all purposes as if fully set forth herein.

BACKGROUND OF THE INVENTION

1. Field of the Invention

The present invention relates to a light emitting device, more particularly to a light emitting device employing non-stoichiometric tetragonal Alkaline Earth Silicate phosphors, which can be used as temperature stable luminescent material for ultraviolet or visible light excitation.

2. Discussion of the Background

A light emitting device (LED) has been widely used for indicators, display boards and display devices since the light emitting device can implement colors. White light can also be implemented, so that the light emitting device has been used for general illumination. Since such a light emitting device has high efficiency and long life span and is ecological, the fields in which the light emitting device is used have been continuously extended.

In the field of LED, various methods for implementing colors, for example white light, have been suggested, and the technique to dispose phosphors around a light emitting diode and combine light emitted from the light emitting diode and light emitted from the phosphors is generally used to implement white light.

In the meantime, stoichiometric silicates such as Orthosilicates, Disilicates and Chlorosilicates are well known as converter materials for short or long wave excitation like ultraviolet as well as daylight radiation. (G. Roth; et al. "Advanced Silicate Phosphors for improved white LED" (Phosphor Global summit Seoul/Korea, Mar. 5-7, 2007))

Especially, silicate phosphors excited by blue light from an LED and emitting converted light are used in light emitting devices for implementing white light or color for demand for several applications. In the last years, the use of silicates has been increasing for LED applications.

The LEDs and especially the High Power LEDs produce a lot of heat during operation. Additionally, LEDs have to withstand high ambient temperature above 80° C. Phosphors themselves have a system depending on temperature-behavior. The brightness of most phosphors is decreasing with increasing temperatures.

This so-called temperature quenching depends on the interactions between activator and host lattice and is influenced by the composition of the matrix, structure, lattice effects, concentration as well as the kind of activator. In particular, the strength of the bonding within the crystal matrix is influencing the extension of the lattice parameters and from this the emission properties of the activator ions.

Furthermore, by increasing the temperature the oscillation of the ions within the lattice becomes higher. Because of this, the probability of an interaction with the activator ions becomes higher, resulting in an increasing loss of exciting energy in form of heat. This so-called Photon-Photon Coupling strongly depends on the structure and the surrounding of the activator ions. Greater rigidity in the crystal lattice results in less interaction between ions and activator.

The brightness of Orthosilicates, Disilicates as well as Chlorosilicates activated by divalent Europium decreases strongly with higher temperatures up to 150° C. because the lattice is not so rigid and the strength of the bonding is not so high.

This effect leads e.g. to a changing of the color of the LED during operation. This is a serious disadvantage of the use of common Silicates known until now for LED applications. Furthermore, the sensitivity against water is comparably high caused by the weak lattice and a highly heteropolar bonding between the Silicate ion and the Alkaline Earth ions.

Silicate phosphors have been developed in the recent years as luminescent materials for white LEDs. (WO 02/054503, WO 02/054502, WO 2004/085570)

Orthosilicates as luminescent material with an excitability from short ultraviolet radiation up to visible light can be used as phosphors for fluorescent lamps. (Barry, T. L., "Fluorescence of $Eu^{2+}$-activated phases in binary Alkaline Earth Orthosilicate systems," J. Electrochem. Soc., 115, 1181 (1968))

Co-doped Tristrontium-silicates are disclosed as yellow-orange luminescent material (H. G. Kang, J. K. Park, J. M. Kim, S. C. Choi; Solid State Phenomena, Vol 124-126 (2007) 511-514), Divalent europium as activator for silicates (S. D. Jee, J. K. Park, S. H. Lee; "Photoluminescent properties of $Eu^{2+}$ activated $Sr_3SiO_5$ Phosphors," J. Mater Sci. 41 (2006) 3139-3141 and Barry, T. L.; "Equilibria and $Eu^{2+}$ luminescence of subsolidus phases bounded by $Ba_3MgSi_2O_8$, $Sr_3MgSi_2O_8$ and $Ca_3MgSi_2O_8$," J. Electrochem. Soc., 115, 733, 1968), and fluorescence for excitation by UV and blue radiation is disclosed in several Silicate systems as Orthosilicates and Disilicates. (G. Blasse, W. L. Wanmaker, J. W. ter Vrugt and A. Bril; "Fluorescence of $Europium^{2+}$-activated silicates," Philips Res. Repts 23, 189-200, 1968).

All these phosphors have the disadvantage that they have strong temperature quenching and a strong shift of the emission band with the temperature. The emission intensity can be dropped down to 50% at 150° C.

SUMMARY OF THE INVENTION

An object of the present invention is to provide a light emitting device where the decrease of brightness thereof due to the increase of temperature can be prevented or reduced.

Other object of the present invention is to provide a light emitting device with lower sensitivity against water, humidity and polar solvents Another object of the present invention is to provide a light emitting device, which shows a color rendering index (CRI) of 80~95, especially 90~95 and has high color temperature range from about 2,000K to 8,000K or 10,000K.

According to embodiments of the present invention, a light emitting device employing non-stoichiometric tetragonal Alkaline Earth Silicate phosphors is provided. The light emitting device comprises a light emitting diode emitting light of ultraviolet or visible light, and a non-stoichiometric luminescent material disposed around the light emitting diode. The luminescent material absorbs at least a portion of the light emitted from the light emitting diode and emits light having a different wavelength from the absorbed light. The non-stoichiometric luminescent material has tetragonal crystal structure, and contains more silicon in its crystal lattice than that in the crystal lattice of silicate phosphors having stoichiometric crystal structure.

In addition, the luminescent material contains divalent copper in its matrix and may contain europium as an activator.

The energetic ground level of divalent Europium $4f^7$ can be excited by ultraviolet as well as blue radiation. Divalent Europium emits light in dependence on the crystal field splitting from around 365 nm in the ultraviolet region at small crystal field splitting, e.g. in Tetra borate phosphors, up to 650 nm with red emission at high crystal field splitting, e.g. in Nitrides.

The emission itself depends on both the covalence, the so-called nephelauxetic effect, and the strength of the crystal field. The strength of the crystal field depends on the distance of activator ions and oxygen within the host lattice. Both effects lead to decreasing and splitting of the excited $4f^65d$ level of divalent Europium and result in a shifting of the emission to longer wavelength and smaller energy of the emission.

The difference between exciting radiation and emitting radiation is the Stokes shift. In Orthosilicates, Disilicates as well as Chlorosilicates, the Stokes shift is between 160 nm and 360 nm, and depends on the exciting radiation as well as the excitability of divalent Europium within the host lattice.

In Orthosilicates, e.g. the activator ion Europium 2+ is surrounded by oxygen ions in different distance caused by the orthorhombic structure. Best temperature stability has been observed with Barium rich systems, in which the Europium ions have shortened the host lattice and stabilized the crystal structure.

The introduction of more Strontium or Calcium or other cations besides Barium into the Orthosilicate lattice can disturb the symmetry near of the activator ions and leads to energetic traps and stronger interactions between Europium and the lattice traps. These traps play an important role within the temperature quenching process, and the energy transfer process within the crystal is disturbed. Furthermore, the sensitivity against humidity is increasing with increasing number of lattice defects like traps.

An important point is the reduction of interactions between the rare earth metal Europium and the stabilization of its surrounding. That has been realized by developing Tetragonal Copper Alkaline Earth Silicates (CSE) activated by divalent Europium. Divalent Copper ions within tetragonal silicate structure lead to lattice parameters (e.g. $(Cu, Sr)_3SiO_5$ with a=6.91 Å; c=9.715 Å) smaller than for tetragonal lattice without copper (e.g. $Sr_3SiO_5$ with a=6.93 Å; c=9.73 Å).

The lattice parameters are strongly different from lattice parameters of the well-known Orthosilicates with a=5.682 Å, b=7.09 Å and c=9.773 Å. Here, the surrounding of divalent Europium is influenced by the orthorhombic structure.

Tetragonal Copper Alkaline Earth Silicates show more stable temperature behavior above 100° C. Here, copper is very important for the phosphor preparation. By incorporation of copper into a common Alkaline Earth Silicate, three effects could be obtained.

Firstly, copper is accelerating the solid state reaction during the heating process. Secondly, copper containing phosphors show improved emission intensities compared to luminescent materials having not that component in the host lattice and copper stabilizing the surrounding around the activator. Thirdly, the copper containing phosphors show a shifting of the emission to longer wavelength.

Copper as a basic element does not react as activator but the use of this ion leads to an influence on the crystal field splitting as well as the covalence. The incorporation of copper accelerates the solid state reaction during temperature processing and leads to homogeneous high brightness phosphor which is stable at high temperatures.

Copper(II) has a smaller ionic radius (about 60 pm) and electro-negativity (1.8) is higher than the electro-negativity of Barium, Strontium and Calcium (1). Furthermore, Copper(II) has a positive electrochemical reduction potential of +0.342 in contradiction to the negative potential of Alkaline Earth metals (−2.8 to −2.9). It is shown that copper is stabilizing the emission of Europium within the silicate host lattice.

Furthermore, the water stability can be improved. It is known that Alkaline Earth Silicate phosphors are unstable in water, air humidity, water steam or polar solvents.

Silicates with orthorhombic as well as Akermanite or Merwinite structures show more or less high sensitivity to water, air humidity, water steam or polar solvents caused by high basicity. Due to higher covalence and a lower basicity as well as a positive reduction potential, the incorporation of copper as a basic matrix component in a host lattice improves the behavior of luminescent silicates against water, air humidity, water steam or polar solvents.

The disadvantage of the strong temperature dependence can be overcome by changing the composition of the phosphor and additionally by introducing copper into such a tetragonal silicate matrix and by preparing special non-stoichiometric copper Alkaline Earth Silicates with a high temperature calcinations procedure.

Some embodiments of the present invention employ high temperature stable tetragonal Copper Alkaline Earth Silicate phosphors activated by at least divalent Europium which emits light within the range of 500 nm to 630 nm. These phosphors show a better stability against water and humidity and can be used with advantage for high brightness LED applications. The phosphors are represented as the following formula 1.

$$(Ba_uSr_vCa_wCu_x)_{3-y}(Zn,Mg,Mn)_zSi_{1+b}O_{5+2b}:Eu_a \quad \text{[Formula 1]}$$

Wherein, u+v+w+x=1, y=z+a, z≦2, 0<x≦1, 0<a≦0.5, and 0<b<0.5. And, a tetragonal non-stoichiometric silicate can be provided where Copper is basically an essential part of the matrix.

The phosphors may be made by a multi-step high temperature solid state reaction between the starting materials comprising a surplus of $SiO_2$ and metal compounds, e. g. metal oxides and metal carbonates, which decompose at high temperatures into oxides. The high temperature solid state reaction may be performed between 800° C. and 1550° C.

In the meantime, the light emitting device may implement white light or desired light of color in combination with light emitted from the light emitting diode and light emitted from the luminescent material. For example, white light or desired light of color may be implemented by mixing light emitted from the light emitting diode and light emitted from the luminescent material. Furthermore, other phosphor may be added to implement desired light of color.

For example, the light emitting may implement white light with CRI of Ra=80~95, especially 90~95 by the light emitting diode emitting blue light and the luminescent material.

The luminescent material, that is, the phosphor may be disposed on at least one of side, top and bottom faces of the light emitting diode. Further, the phosphor may be mixed into an adhesive or a molding member so that the phosphor can be disposed around the light emitting diode.

In the meantime, the light emitting diode and the luminescent material may be configured within one package. In addition, other light emitting diode may be configured within the package. The other light emitting diode may emit light of the same wavelength as or a different wavelength from the above light emitting diode. For example, the other light emitting diode may emit light of longer wavelength than the emission peak wavelength of the luminescent material.

The package may include a substrate comprising a printed circuit board or a lead frame, on which the light emitting diode is mounted. In addition, the package may further comprise a reflector reflecting light emitted from the light emitting diode. In this case, the light emitting diode is mounted in the reflector.

Moreover, the light emitting device may further comprise a molding member encapsulating the light emitting diode on the substrate. The luminescent material may be distributed in the molding member, but not limited thereto.

Further, the package may comprise a heat-sink, and the light emitting diode may be mounted on the heat-sink.

In embodiments of the present invention, the light emitting diode may be formed of (Al, Ga, In)N based composite semiconductor.

The light emitting diode may have, for example, a double heterostructure, a single quantum well structure, or a multi-quantum well structure, which has a single active region between n-type and p-type semiconductor layers.

Otherwise, the light emitting diode may comprise a plurality of light emitting cells spaced apart from one another on a single substrate. Each of the light emitting cells comprises an active region, and these light emitting cells may be connected to one another in series and/or in parallel through wires so that the light emitting cells can be directly driven under AC power supply. Such an AC-light emitting diode can be driven in connection to AC power supply without an outer AC-DC converter by forming a bridge rectifier and a series array of light emitting cells connected to the rectifier, or by forming series arrays of light emitting cells on a single substrate, these arrays being electrically connected to each other in anti-parallel.

According to the embodiments of the present invention, light emitting devices having improved temperature and humidity stability can be provided by employing the non-stoichiometric tetragonal Alkaline Earth Silicate phosphors. Furthermore, light emitting devices with higher temperature stability and lower sensitivity against water, humidity and polar solvents can be provided as well as with high color temperature range from about 2,000K to 8,000K or 10,000K showing a CRI of 80~95, especially 90~95 can be provided by employing tetragonal copper Alkaline Earth Silicate phosphors which are activated by divalent europium (Eu) and emit light having wavelength between about 500 nm to 630 nm.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Light emitting devices according to embodiments of the present invention will now be described with reference to the accompanying drawings.

Figure 1:
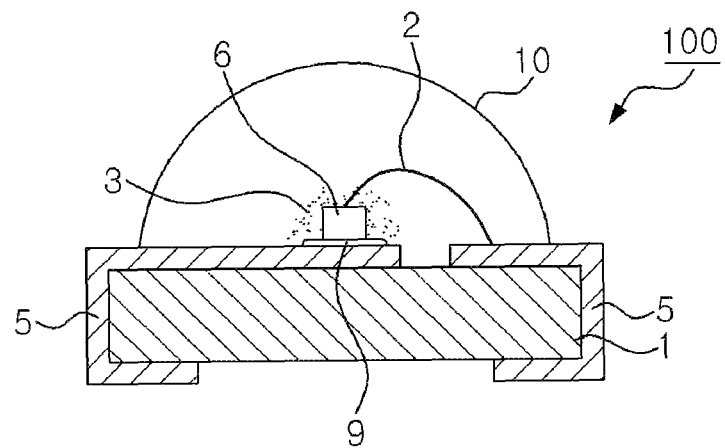
FIG. 1 is a cross-sectional view of a light emitting device according to an embodiment of the present invention.

FIG. 1 is a cross-sectional view of a light emitting device 100 according to an embodiment of the present invention. FIG. 1 shows a chip-type package comprising at least one light emitting diode and a luminescent material.

Referring to FIG. 1, electrodes 5 may be formed on both sides of substrate 1. Light emitting diode 6 emitting primary light may be mounted on one of the electrodes 5. The light emitting diode 6 may be mounted on one electrode 5 through electrically conductive paste 9, such as Ag paste, and be connected to other electrode 5 via an electrically conductive wire 2.

The light emitting diode 6 may emit ultraviolet or blue light and can be fabricated of gallium nitride based composite semiconductor. Especially, the light emitting diode 6 emits blue light.

A luminescent material 3 may be placed on the top and side faces of the light emitting diode 6. And, the light emitting diode 6 may be sealed with a molding member 10 formed of thermosetting resin. The luminescent material 3 may be placed near the light emitting diode 6, but it is not limited thereon. The luminescent material 3 can also be uniformly distributed in the molding member 10. Such a method of distributing the luminescent material 3 within the molding member 10 has been disclosed in U.S. Pat. No. 6,482,664.

The luminescent material 3, while being disposed around the light emitting diode 6, absorbs at least a portion of the light emitted from the light emitting diode and emits light having a different wavelength from the absorbed light. The luminescent material 3 is a non-stoichiometric silicate phosphor having a tetragonal crystal structure and containing more silicon in its crystal lattice than in the crystal lattice of silicate phosphors having stoichiometric crystal structures. The luminescent material 3 will be described below in detail.

Light emitting diode 6 may be electrically connected to an external power supply through electrodes 5, and thus emits primary light. The luminescent material 3 absorbs at least a portion of the primary light and emits secondary light of a wavelength longer than that of the primary light. As a result, the primary light emitted from the light emitting diode 6 and the secondary light from the luminescent material 3 are mixed together, and the mixed light is emitted from the light emitting device. A desired color of light, for example white light, may be implemented by this mixed light.

The light emitting device 100 can comprise two or more light emitting diodes. These light emitting diodes may have same emission peaks to each other, or may have different emission peaks from each other. For example, the light emitting device 100 may comprise same or different light emitting diodes each emitting ultraviolet or blue light. Furthermore, the light emitting device 100 may comprise a light emitting diode, for example a red light emitting diode, which emits light with a wavelength longer than the emission peak wavelength of the phosphors. Such a longer wavelength light emitting diode may be employed for improving a CRI of the light emitting device 100. Moreover, the light emitting device 100 may further comprise other phosphors in addition to the non-stoichiometric luminescent material 3. The other phosphors may comprise stoichiometric silicate phosphors, YAG based phosphors or thiogallate phosphors, but it is not limited thereto. Accordingly, light of color desired by users can be implemented with proper selection for the light emitting diode 6 and phosphors.

Especially, the light emitting device having high color temperature range from about 2,000K to 8,000K or 10,000K and a CRI of 80~95, especially 90~95 can be provided with proper selection for the light emitting diode 6, the luminescent material 3 and other phosphors.

Figure 2:
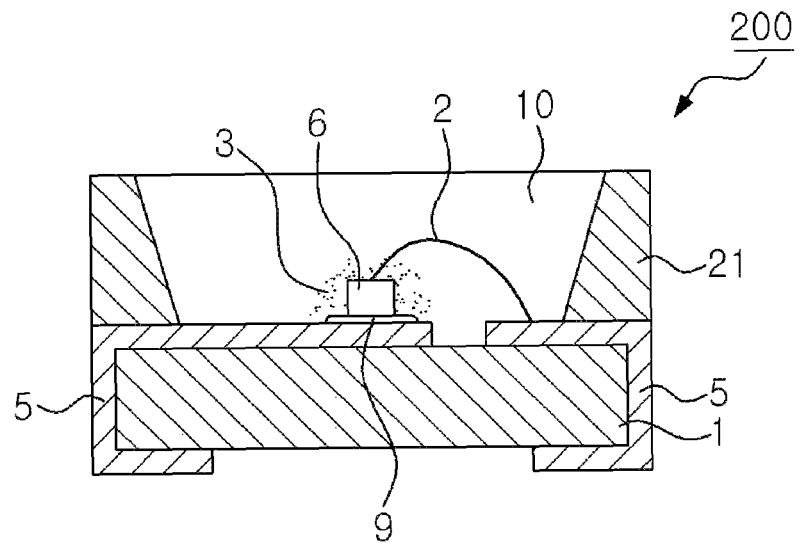
FIG. 2 is a cross-sectional view of a light emitting device according to another embodiment of the present invention.

FIG. 2 is a cross-sectional view of a light emitting device 200 according to another embodiment of the present invention. FIG. 2 shows exemplary top-view package having a reflector 21.

Referring to FIG. 2, the light emitting device 200 has a similar structure as that of the above light emitting device 100, and has a reflector 21 on the substrate 1. A light emitting diode 6 is mounted in the reflector 21. The reflector 21 reflects light emitted from the light emitting diode 6 to increase brightness within a certain viewing angle.

In the meantime, as described with reference to FIG. 1, a luminescent material 3, while being disposed around the light emitting diode 6, absorbs at least a portion of the light emitted from the light emitting diode and emits light having a different wavelength from the absorbed light. The luminescent material 3 are dotted on the light emitting diode 6 in the reflector 21 or uniformly distributed within a thermosetting resin molding member 10. The luminescent material 3 will be described below in detail.

The light emitting device 200 may also comprise two or more light emitting diodes having same emission peaks to each other, or different emission peaks from each other, and may further comprise other phosphors in addition to the non-stoichiometric luminescent material 3, as described with reference to FIG. 1.

In some embodiments of the present invention, the light emitting device 100 or 200 shown in the FIG. 1 or FIG. 2 can include a substrate 1 of a metallic material, for example a metal PCB, which has good heat conductivity. Such a substrate may easily dissipate the heat from the light emitting diode 6. Furthermore, a lead frame including lead terminals may be used as the substrate 1. Such a lead frame may be surrounded and supported by the molding member 10 encapsulating the light emitting diode 6.

In FIG. 2, the reflector 21 may be formed of a different material from the substrate 1, but not limited thereto. The reflector 21 may be also formed of the same material as the substrate 1. For example, a lead frame having lead terminals can be insert-molded of a plastic, such as a PPA, which forms the substrate 1 and the reflector 21 together. Then, the lead terminals are bent to form electrodes 5.

Figure 3:
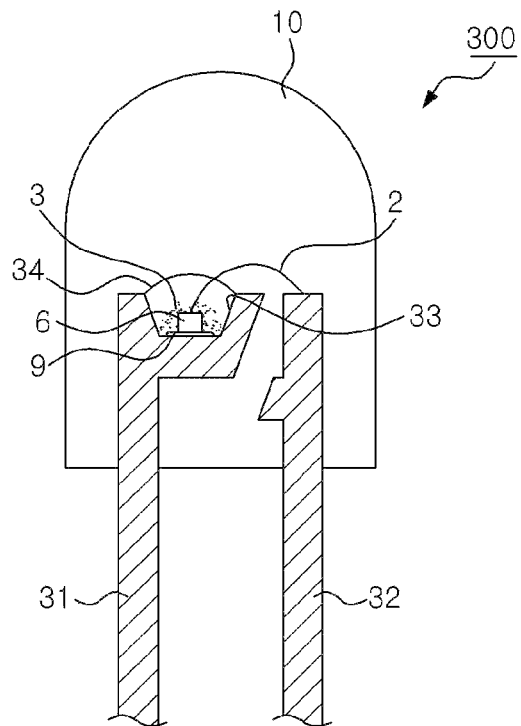
FIG. 3 is a cross-sectional view of a light emitting device according to another embodiment of the present invention.

FIG. 3 is a cross-sectional view of a light emitting device 300 according to another embodiment of the present invention. The light emitting device 300 has been known as a light emitting diode lamp.

Referring to FIG. 3, the light emitting device 300 may have a pair of lead electrodes 31, 32, and a cup portion 33 having a shape of cup may be formed at the upper end of one lead electrode 31. At least one light emitting diode 6 may be mounted in the cup portion 33, and electrically connected to the other lead electrode 32 through a conductive wire 2. When a plurality of light emitting diodes 6 is mounted in the cup portion 33, they may emit light of same wavelength or different wavelengths from each other.

Further, a luminescent material 3 is disposed around the light emitting diode 6. As described with reference to FIG. 1, the luminescent material 3, while being disposed around the light emitting diode 6, absorbs at least a portion of the light emitted from the light emitting diode and emits light having a different wavelength from the absorbed light. The luminescent material 3 is dotted on the light emitting diode 6 in the cup portion 33 or uniformly distributed within a thermosetting resin molding member 34 formed in the cup portion 33. The luminescent material 3 will be described below in detail.

In the meantime, a molding member 10 encapsulates the light emitting diode 6, the luminescent material 3, and portions of the pair of lead electrodes 31 and 32. The molding member 10 may be formed of epoxy or silicone.

The light emitting device 300 has been described to have a pair of lead electrodes 31 and 32. However, the light emitting device 300 may have more lead electrodes than the pair of lead electrodes 31 and 32.

Figure 4:
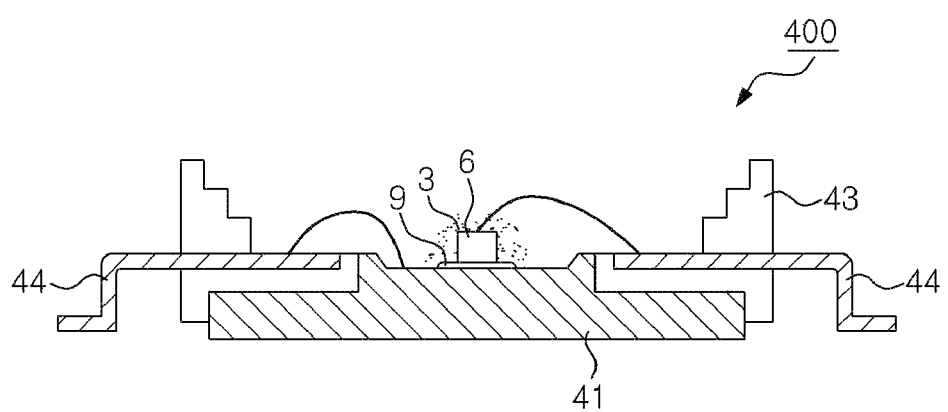
FIG. 4 is a cross-sectional view of a light emitting device according to yet another embodiment of the present invention.

FIG. 4 is a cross-sectional view of a light emitting device 400 according to yet another embodiment of the present invention. FIG. 4 shows a light emitting diode package for high power.

Referring to FIG. 4, the light emitting device 400 comprises a heat-sink 41 provided in a housing 43. The bottom surface of the heat sink 41 is exposed to outside. Lead electrodes 44 are exposed within the housing 43, and extended through the housing 43. At least one light emitting diode 6 is mounted on the upper surface of the heat-sink 41 through an electrically conductive adhesive 9, and electrically connected to one of the lead electrodes 44 through an electrically conductive wire. Furthermore, another electrically conductive wire may connect the other lead electrode 44 to the heat-sink 41, such that the light emitting diode 6 can be electrically connected to each of the two lead electrodes 44.

Further, a luminescent material 3 is disposed around the light emitting diode 6 on the heat-sink 41. As described with reference to FIG. 1, the luminescent material 3, while being disposed around the light emitting diode 6, absorbs at least a portion of the light emitted from the light emitting diode 6 and emits light having a different wavelength from the absorbed light. The luminescent material 3 is dotted on the light emitting diode 6 on the heat-sink 41, or uniformly distributed within a molding member (not shown) covering the light emitting diode 6. The luminescent material 3 will be described below in detail.

Figure 5:
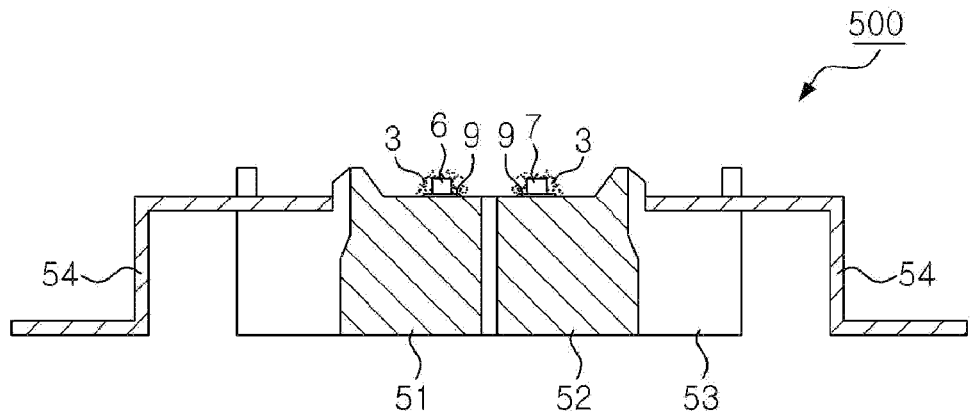
FIG. 5 is a cross-sectional view of a light emitting device according to yet another embodiment of the present invention.

FIG. 5 is a cross-sectional view of a light emitting device 500 according to yet another embodiment of the present invention.

Referring to FIG. 5, the light emitting device 500 comprises a housing 53 and a plurality of heat-sinks 51 and 52 which are joined to the housing 53 and insulated from each other. Light emitting diodes 6 and 7 are mounted on the heat-sinks 51 and 52 through electrically conductive adhesives 9, and electrically connected to lead electrodes 54 through electrically conductive wires (not shown), respectively. The lead electrodes 54 are extended from inside of the housing 53 to outside. Two lead electrodes 54 are shown in FIG. 5, but more lead electrodes may be provided thereto.

Further, a luminescent material 3 may be disposed around at least one of the light emitting diodes 6 and 7, as described with reference to FIG. 4. The luminescent material 3 will be described below in detail. Further, light emitting diode 7 may emit light of a longer wavelength than the emission peak wavelength of the luminescent material 3, which may be a non-stoichiometric luminescent material as described in more detail below.

In the above embodiments of the present invention, it is described that the light emitting diode 6 is mounted on the substrate 1, or on the cup portion 33, or on the heat-sink 41, 51, or 52 through the electrically conductive adhesive 9, and electrically connected to the electrode or lead electrode through the electrically conductive wire. These embodiments are limited when the light emitting diode 6 is a "one-bond die," which has its electrodes on the top side and bottom side thereof, respectively. In the case where the light emitting diode 6 is a "two-bond die", which has its two electrodes on the top side thereof, the light emitting diode 6 may be electrically connected to the electrodes or lead electrodes through two electrically conductive wires, respectively. In this case, the adhesive need not to be electrically conductive.

In the embodiments of the present invention, the light emitting diode 6 may be formed of (Al, Ga, In)N based composite semiconductor.

The light emitting diode 6 may have, for example, a double heterostructure, a single quantum well structure, or a multi-quantum well structure, which has a single active region between n-type and p-type semiconductor layers.

Otherwise, the light emitting diode 6 may comprise a plurality of light emitting cells spaced apart from one another on a single substrate. Each of the light emitting cells comprises an active region, and these light emitting cells may be connected to one another in series and/or in parallel through wires so that the light emitting cells can be directly driven under alternating current (AC) power supply rather than a direct current (DC) power supply. Such an AC-light emitting diode can be driven in connection to AC power supply without an outer AC-DC converter by forming a bridge rectifier and a series array of light emitting cells connected to the rectifier, or by forming series arrays of light emitting cells on a single substrate, these arrays being electrically connected to each other in anti-parallel. The operating voltage of the AC-light emitting diode can be increased up to the voltage for domestic use, for example, 110V or 220V, since the light emitting cells are connected in series. Thus, a light emitting device, which can be driven by domestic power supply, can be provided.

Furthermore, the luminescent material 3 may be disposed between the light emitting diode 6 and the substrate 1 or the heat-sink on which the light emitting diode 6 is mounted, and may be distributed within the adhesive 9. Such a luminescent material 3 absorbs at least a portion of the light emitted downward from the light emitting diode 6 and emits light having a different wavelength from the absorbed light.

Though several structures for the light emitting device have been described above, the present invention is not limited these structures, and the structure of the light emitting device of the present invention can be modified depending on the kind of the light emitting diode, electrical connection method thereof, a desired viewing angle of light, the purpose to use the light emitting device, etc.

The luminescent material 3, which is used in embodiments of the present invention, is now described.

The luminescent material is a non-stoichiometric luminescent material, which is a silicate phosphor having tetragonal crystal structure and containing more silicon in the crystal lattice than that in the crystal lattice of silicate phosphors having stoichiometric crystal structure. In addition, the luminescent material contains divalent copper in its matrix and may contain europium as an activator.

Such a luminescent material may be represented as the following formula 1.

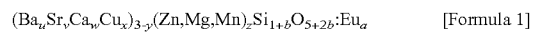

$(Ba_u Sr_v Ca_w Cu_x)_{3-y}(Zn,Mg,Mn)_z Si_{1+b} O_{5+2b}:Eu_a$ [Formula 1]

Wherein, $u+v+w+x=1$, $y=z+a$, $z \leq 2$, $0 < x \leq 1$, $0 < a \leq 0.5$, and $0 < b < 0.5$.

The luminescent material is a silicate phosphor having tetragonal crystal structure different from orthosilicate phosphors having orohorhombic crystal structure.

And, a tetragonal non-stoichiometric silicate can be provided where Copper is part of the matrix.

The luminescent material may be made by a multi-step high temperature solid state reaction between the starting materials comprising a surplus of $SiO_2$ and metal compounds, e. g. metal oxides and metal carbonates, which decompose at high temperatures into oxides.

Several examples of the luminescent materials manufactured to use in the light emitting device of the present invention and characteristics thereof are now described.

Example 1

Manufacturing method of the luminescent material represented following formula 2 is described.

$Cu_{0.05}Sr_{2.91}Si_{1.05}O_{5.1}:Eu_{0.04}$ [Formula 2]

Figure 8:
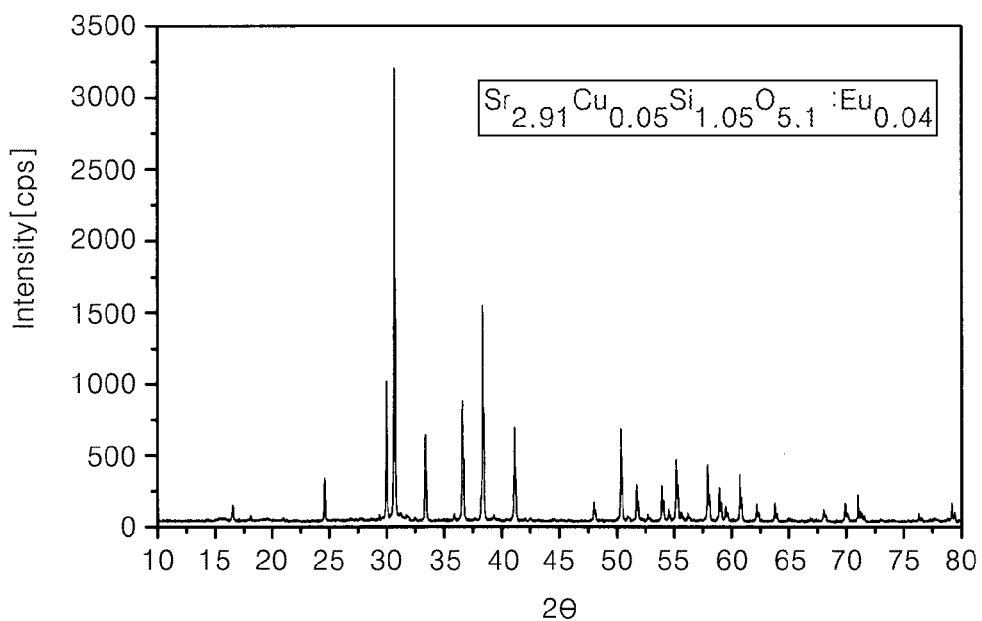
FIG. 8 shows X-ray diffraction patterns of a non-stoichiometric Copper containing Oxy-Orthosilicate having tetragonal structure.
Figure 9:
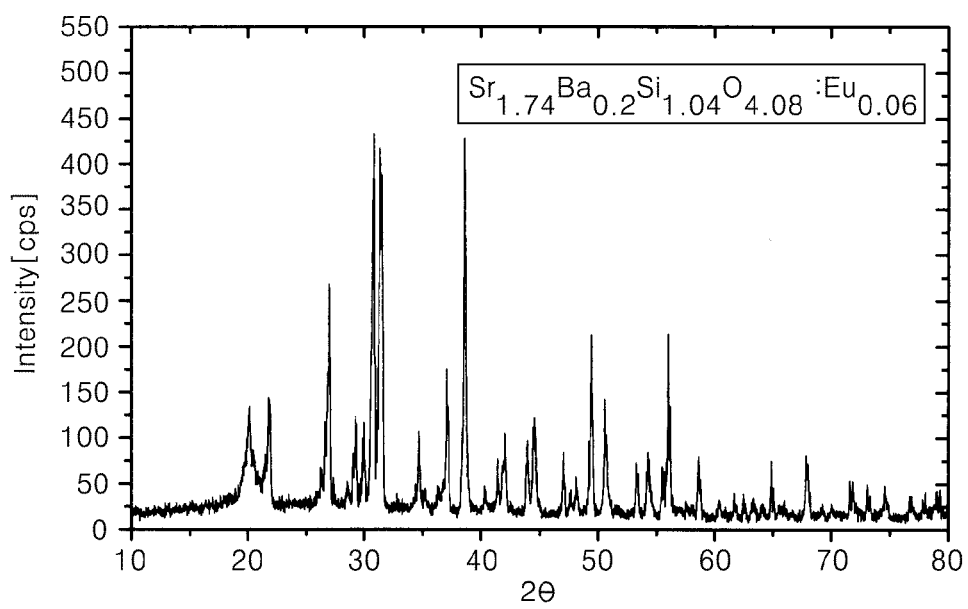
FIG. 9 shows X-ray diffraction patterns of a non-stoichiometric yellow emitting Orthosilicate having Olivine structure.
Figure 10:
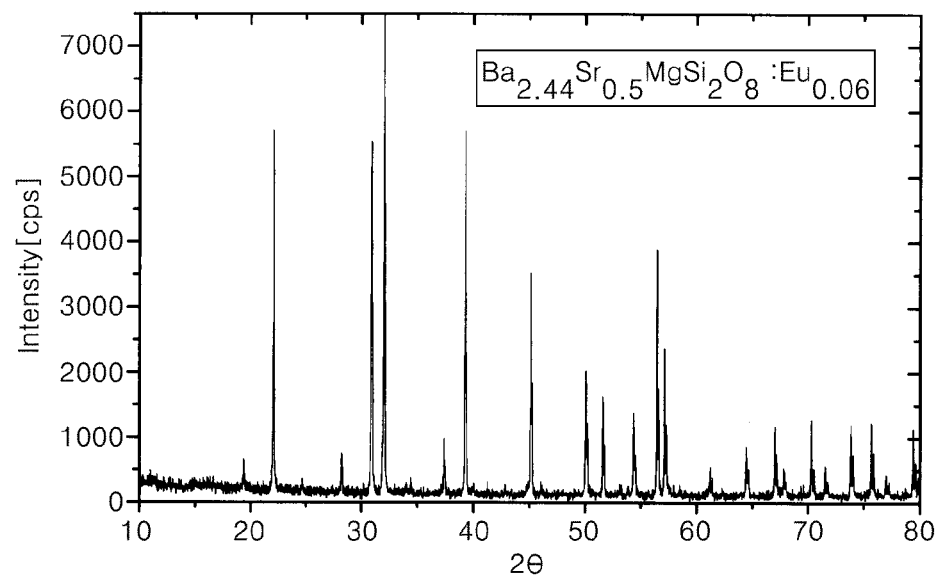
FIG. 10 shows X-ray diffraction patterns of a blue emitting Ortho-Disilicate having Merwinite structure.
Figure 11:
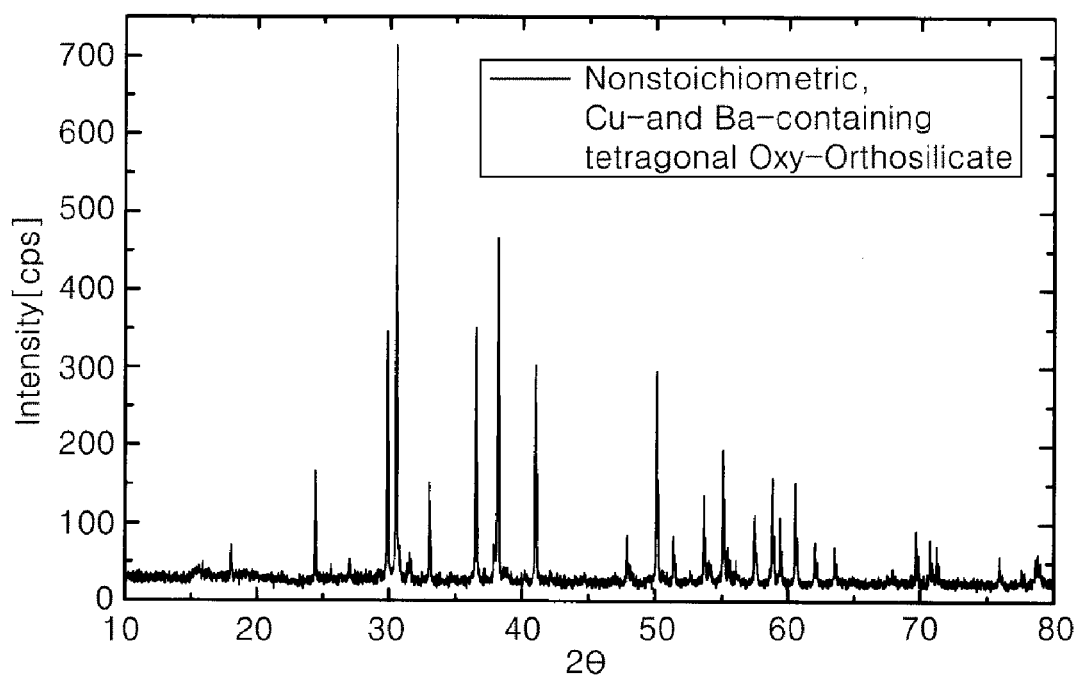
FIG. 11 shows X-ray diffraction patterns of a non-stoichiometric Oxyorthosilicate with 0.4 Mol Ba.

As starting materials for 1 Mol phosphor, CuO (3.98 g), $SrCO_3$ (429.60 g), $SiO_2$ (63.09 g), $Eu_2O_3$ (14.08 g) and/or any combinations thereof are used. The starting materials in form of very pure oxides as well as carbonates are mixed with the appropriate surplus of Silica together with small amounts of flux ($NH_4Cl$ 16 g). In a first step, the mixture is fired in an alumina crucible at 1,350° C. in an inert gas atmosphere ($N_2$ or noble gas) for 2~4 hours. After pre-firing, the material is milled. In a second step, the mixture is fired in an alumina crucible at 1,350° C. in weakly reducing atmosphere for additional 4 hours. Then, the material is milled, washed, dried and sieved. The luminescent material has an emission maximum at about 580 nm (shown in FIG. 7), and crystallizes in the tetragonal structure (shown in FIG. 8) which is clearly different from the Orthosilicates (shown in FIGS. 9 and 10).

Figure 12:
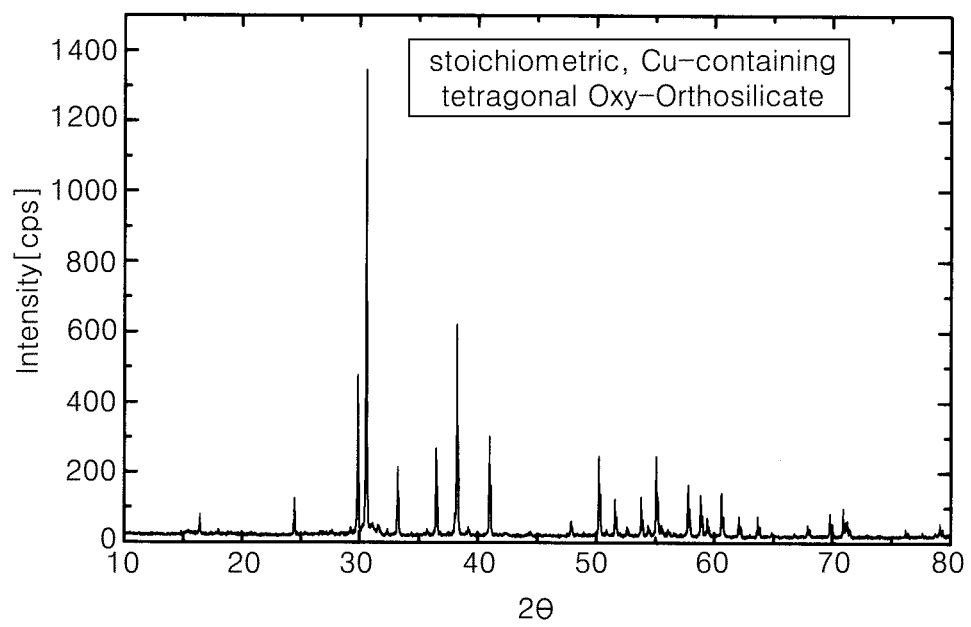
FIG. 12 shows X-ray diffraction patterns of a stoichiometric Strontium-Oxyorthosilicate.

In table 1, results of the X-ray diffraction analysis are written down. There is evidence from FIG. 8-11 and Table 1 (shown below) that the structure has been changed caused by non-stoichiometry and Copper. This difference can also be seen clearly by comparing FIG. 8 for a non-stoichiometric and FIG. 12 for a stoichiometric Oxy-Orthosilicate, especially for the diffraction pattern in the region 2Θ=32-42°.

TABLE 1

Powder X-ray spacing of the 15 strongest reflections (Cu—K$_{α1}$ radiation) of some Silicate phosphors compared with data from Literature.

| No. | stoichiometric Sr$_3$SiO$_5$ * [Å] | Non-stoichiometric Orthosilicate Sr$_{1.78}$Ba$_{0.16}$Eu$_{0.06}$Si$_{1.04}$O$_{4.08}$ [nm] | Non-stoichiometric Ortho-Disilicate Ba$_{2.44}$Sr$_{0.5}$MgEu$_{0.06}$Si$_{2.07}$O$_{8.14}$ [nm] | Non-stoichiometric Oxy-orthosilicate Sr$_{2.94}$Cu$_{0.02}$Eu$_{0.04}$Si$_{1.03}$O$_{5.06}$ [nm] | Non-stoichiometric Oxy-Orthosilicate Sr$_{2.74}$Cu$_{0.02}$Ba$_{0.2}$Eu$_{0.04}$Si$_{1.03}$O$_{5.06}$ [nm] | Non-stoichiometric Oxy-Orthosilicate Sr$_{2.54}$Cu$_{0.02}$Ba$_{0.4}$Eu$_{0.04}$Si$_{1.03}$O$_{5.06}$ [nm] |
|---|---|---|---|---|---|---|
| 1  | 3.595 | 0.4418 | 0.4023 | 0.5388 | 0.3642 | 0.3639 |
| 2  | 3.512 | 0.4063 | 0.2892 | 0.3633 | 0.2992 | 0.2988 |
| 3  | 2.967 | 0.3300 | 0.2793 | 0.2990 | 0.2927 | 0.2925 |
| 4  | 2.903 | 0.3042 | 0.2293 | 0.2923 | 0.2701 | 0.2707 |
| 5  | 2.675 | 0.2904 | 0.2007 | 0.2693 | 0.2461 | 0.2458 |
| 6  | 2.444 | 0.2847 | 0.1821 | 0.2460 | 0.2354 | 0.2356 |
| 7  | 2.337 | 0.2831 | 0.1771 | 0.2352 | 0.2201 | 0.2199 |
| 8  | 2.187 | 0.2416 | 0.1687 | 0.2201 | 0.1899 | 0.1898 |
| 9  | 1.891 | 0.2328 | 0.1630 | 0.1816 | 0.1818 | 0.1820 |
| 10 | 1.808 | 0.2176 | 0.1612 | 0.1771 | 0.1774 | 0.1778 |
| 11 | 1.660 | 0.2055 | 0.1395 | 0.1703 | 0.1705 | 0.1707 |
| 12 | 1.589 | 0.2030 | 0.1338 | 0.1667 | 0.1667 | 0.1666 |
| 13 | 1.522 | 0.1889 | 0.1282 | 0.1595 | 0.1598 | 0.1602 |
| 14 | 1.489 | 0.1842 | 0.1256 | 0.1568 | 0.1569 | 0.1569 |
| 15 | 1.343 | 0.1802 | 0.1206 | 0.1526 | 0.1527 | 0.1528 |

* Data from Literature for Sr$_3$SiO$_5$ in Å (10 Å = 1 nm): R. W. Nurse, *J. Appl. Chem.*, 2 May 1952, 244-246

Example 2

Manufacturing method of the luminescent material represented following formula 3 is described.

$$Cu_{0.02}Sr_{2.54}Ba_{0.4}Si_{1.03}O_{5.06}:Eu_{0.04} \quad \text{[Formula 3]}$$

As starting materials for 1 Mol phosphor, CuO (1.59 g), SrCO$_3$ (375.0 g), BaCO$_3$ (78.94 g), SiO$_2$ (61.89 g), Eu$_2$O$_3$ (14.08 g) and/or any combinations thereof are used. The starting materials in form of very pure oxides as well as carbonates are mixed with a surplus of Silica together with small amounts of flux (NH$_4$Cl—26.7 g). In a first step, the mixture is fired in an alumina crucible at 1,300° C. in an inert gas atmosphere for 2~6 hours. After pre-firing, the material is milled again. In a second step, the mixture is fired in an alumina crucible at 1,385° C. in weakly reducing atmosphere for additional 6 hours. Then, the material is milled, washed, dried and sieved. The luminescent material has an emission maximum at about 600 nm (shown in FIG. 7). The structure is analogously to example 1 as shown in table 1 and FIG. 8.

Figure 7:
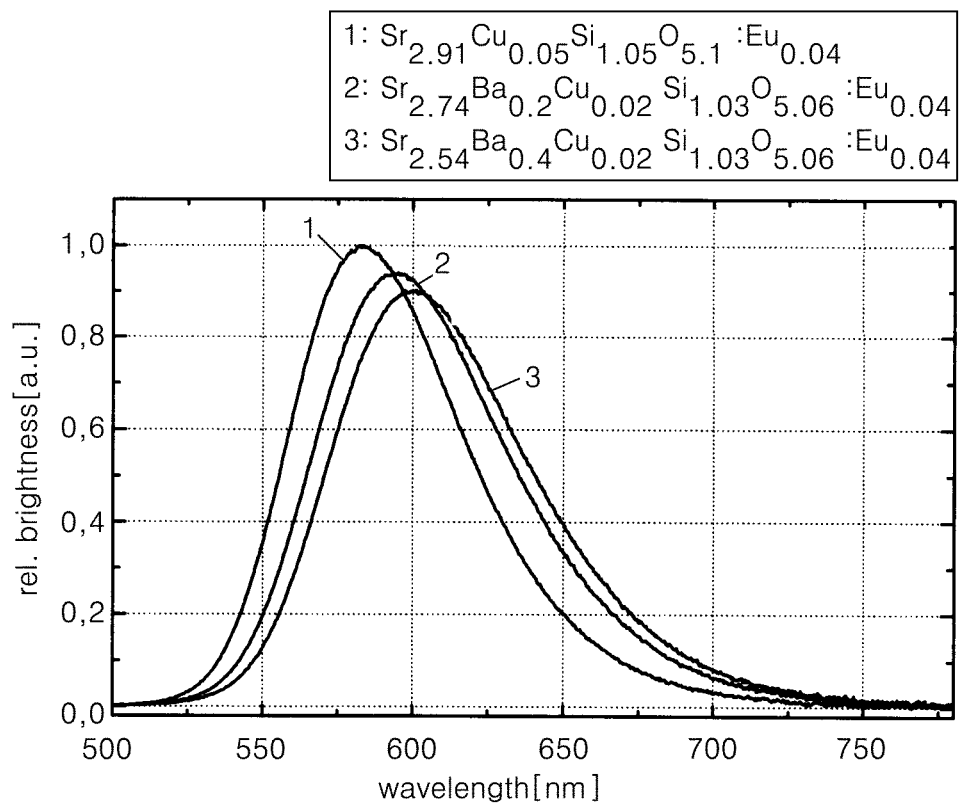
FIG. 7 shows the influence of Ba on the emission spectra of new tetragonal Oxyorthosilicates.

By substitution of only 0.2 Mol Barium for Strontium results in an emission between 1 and 3 in FIG. 7 and to a change in the structure.

Example 3

Manufacturing method of the luminescent material represented following formula 4 is described.

$$Cu_{0.03}Sr_{2.92}Ca_{0.01}Si_{1.03}O_{5.06}:Eu_{0.04} \quad \text{[Formula 4]}$$

As starting materials, CuO (5.57 g), SrCO$_3$ (431.08 g), CaCO$_3$ (1.0 g), SiO$_2$ (61.89 g), Eu$_2$O$_3$ (14.08 g) and/or any combinations thereof are used. The starting materials in form of very pure oxides as well as carbonates are mixed with a surplus of Silica together with small amounts of flux (NH$_4$Cl 24 g). In a first step, the mixture is fired in an alumina crucible at 1,300° C. in an inert gas atmosphere for 2~6 hours. After pre-firing, the material is milled again. In a second step, the mixture is fired in an alumina crucible at 1,370° C. in weakly reducing atmosphere for additional 6 hours. Then, the material is milled, washed, dried and sieved. The luminescent material has an emission maximum at 586 nm.

In the following table 2, Relative brightness of various non-stoichiometric Copper Alkaline Earth Silicates at 25° C., 100° C., 125° C. and 150° C. compared with YAG and common Silicate phosphors under 455 nm excitation is summarized.

TABLE 2

Relative brightness of non-stoichiometric Copper Alkaline Earth Silicates at 25° C., 100° C., 125° C. and 150° C. compared with YAG and common Silicate phosphors under 455 nm excitation

| Composition | Excitation wavelength (nm) | Emission Maximum (nm) | 25° C. | 100° C. | 125° C. | 150° C. |
|---|---|---|---|---|---|---|
| YAG | 455 | 562 | 100 | 92 | 86 | 79 |
| (Ba,Sr)$_2$SiO$_4$: Eu(565 nm) | 455 | 565 | 100 | 92 | 78 | 63 |
| (Sr,Ca)$_2$SiO$_4$: Eu(612 nm) | 455 | 612 | 100 | 87 | 73 | 57 |
| Sr$_{2.96}$SiO$_5$: Eu$_{0.04}$ | 455 | 582 | 100 | 96 | 94 | 90 |
| Cu$_{0.05}$Sr$_{2.91}$Si$_{1.05}$O$_{5.1}$: Eu$_{0.04}$ | 455 | 580 | 100 | 98 | 97 | 94 |
| Cu$_{0.05}$Sr$_{2.51}$Ba$_{0.4}$Si$_{1.03}$O$_{5.06}$: Eu$_{0.04}$ | 455 | 600 | 100 | 96 | 95 | 92 |
| Cu$_{0.07}$Sr$_{2.88}$Ca$_{0.01}$Si$_{1.03}$O$_{5.06}$: Eu$_{0.04}$ | 455 | 586 | 100 | 95 | 94 | 91 |
| Cu$_{0.1}$Ba$_{0.1}$Sr$_{2.56}$Mg$_{0.1}$Mn$_{0.1}$Si$_{1.06}$O$_{5.12}$: Eu$_{0.04}$ | 455 | 575 | 100 | 96 | 94 | 92 |
| Cu$_{0.1}$Ba$_{0.2}$Sr$_{2.46}$Mg$_{0.1}$Ca$_{0.1}$Si$_{1.08}$O$_{5.16}$: Eu$_{0.04}$ | 455 | 572 | 100 | 95 | 94 | 91 |
| Cu$_{0.2}$Ba$_{0.1}$Sr$_{2.56}$Zn$_{0.1}$Si$_{1.02}$O$_{5.04}$: Eu$_{0.04}$ | 455 | 574 | 100 | 97 | 95 | 93 |

Figure 6:
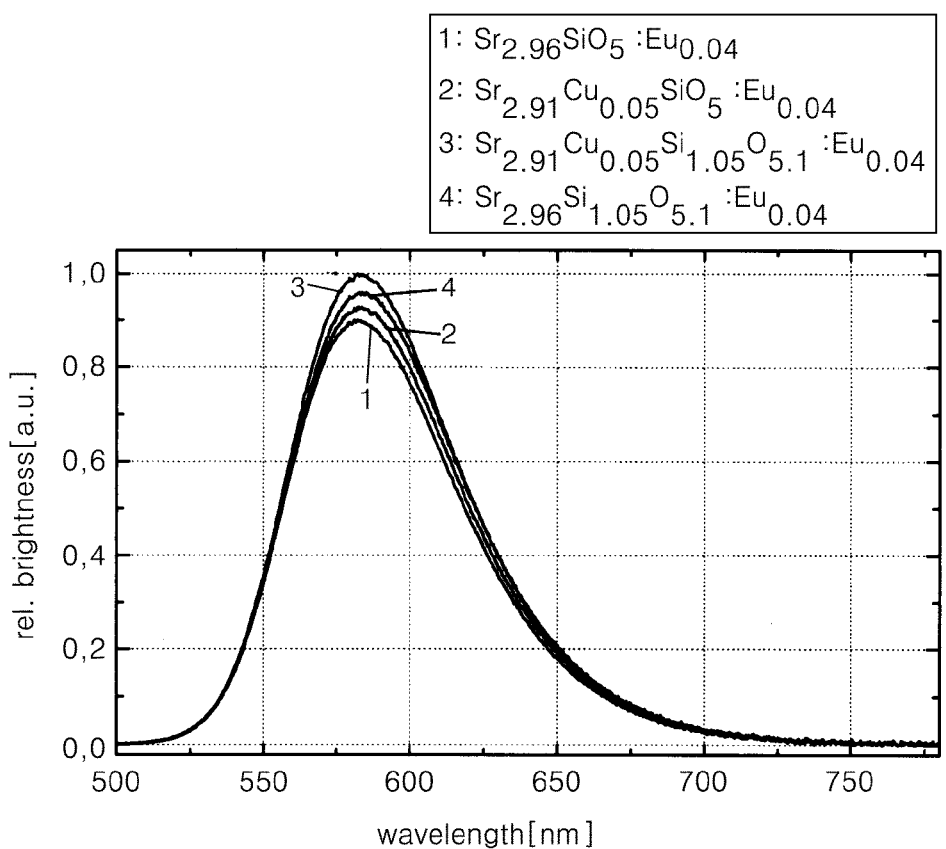
FIG. 6 shows emission spectra of new non-stoichiometric Oxyorthosilicates compared with stoichiometric phosphors; both with and without Copper at 450 nm excitation wavelength.

Non-stoichiometric Oxy-Orthosilicates also show higher emission efficiency compared with the stoichiometric ones. In both cases, the incorporation of $Cu^{2+}$ as host component leads to an improvement of brightness and emission efficiency as can be taken from FIG. 6 for typical orange emitting species.

In the following table 3, sensitivity of non-stoichiometric Copper containing new phosphors against humidity and temperature compared to common Silicate phosphors is summarized. Here, the brightness is measured under 450 nm excitation wavelength with time exposed to the condition of 85° C. temperature and saturated humidity.

TABLE 3

Sensitivity of non-stoichiometric Copper containing new phosphors against humidity and temperature compared to common Silicate phosphors

| Sample | Brightness[%] | | | | | |
| --- | --- | --- | --- | --- | --- | --- |
| | 0 hrs | 24 hrs | 100 hrs | 200 hrs | 500 hrs | 1000 hrs |
| Commercial yellow Orthosilicate (565 nm) | 100 | 98.3 | 98.7 | 93.3 | 84.7 | 79.3 |
| Example 1 | 100 | 99.6 | 99.2 | 97.8 | 94.8 | 91.5 |
| Example 2 | 100 | 98.9 | 99.1 | 96.4 | 93.9 | 90.7 |
| Example 3 | 100 | 99.0 | 98.7 | 98.2 | 95.4 | 93.8 |

All new phosphors show a very good stability against water and humidity as can be taken from table 3.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting device, comprising:
   a light emitting diode; and
   a non-stoichiometric luminescent material disposed to adsorb at least a portion of light emitted from the light emitting diode and configured to emit light having a different wavelength from the adsorbed light,
   wherein the non-stoichiometric luminescent material comprises a silicate phosphor having a tetragonal crystal structure comprising more silicon and more oxygen in the crystal lattice than that in the crystal lattice of silicate phosphors having a stoichiometric crystal structure.

2. The light emitting device of claim 1, wherein the luminescent material contains copper within the crystal lattice.

3. The light emitting device of claim 1, wherein the luminescent material contains divalent copper within the crystal lattice.

4. The light emitting device of claim 1, wherein the luminescent material contains europium as an activator.

5. The light emitting device according to claim 1, wherein the luminescent material comprises a silicate represented as the formula $(Ba_u Sr_v Ca_w Cu_x)_{3-y}(Zn,Mg,Mn)_z Si_{1+b} O_{5+2b}:Eu_a$, wherein, $u+v+w+x=1$, $y=z+a$, $z \leqq 2$, $0 \leqq x \leqq 1$, $0 < a \leqq 0.5$ and $0 \leqq b \leqq 0.5$.

6. The light emitting device of claim 1, wherein the luminescent material is excited by radiation having a wavelength between 250 nm and 500 nm.

7. The light emitting device of claim 1, wherein the luminescent material emits light at the long-wave side of the exciting radiation.

8. The light emitting device of claim 7, wherein the luminescent material emits light having a wavelength between 500 nm and 630 nm.

9. The light emitting device of claim 1, wherein white light or desired color light is implemented by mixing light emitted from the light emitting diode and light emitted from the luminescent material.

10. The light emitting device of claim 1, implementing white light with color rendering index (CRI) of Ra=80~95 by the light emitting diode emitting blue light and the luminescent material.

11. The light emitting device of claim 1, wherein the luminescent material is disposed on at least one of a side face, a top face, and a bottom face of the light emitting diode.

12. The light emitting device of claim 11, wherein the luminescent material is mixed into an adhesive or a molding member.

13. The light emitting device of claim 1, wherein the light emitting diode and the luminescent material are configured within one package.

14. The light emitting device of claim 13, further comprising:
   a second light emitting diode configured within the package,
   wherein the second light emitting diode emits light of longer wavelength than the emission peak wavelength of the luminescent material.

15. The light emitting device of claim 13, wherein the package comprises a substrate, and
   wherein the light emitting diode is mounted on the substrate.

16. The light emitting device of claim 15, wherein the substrate comprises a printed circuit board or a lead frame.

17. The light emitting device of claim 15, wherein the package further comprises a reflector, and
   wherein the light emitting diode is mounted in the reflector.

18. The light emitting device of claim 15, further comprising;
   a molding member encapsulating the light emitting diode on the substrate.

19. The light emitting device of claim 18, wherein the luminescent material is distributed in the molding member.

20. The light emitting device of claim 13, wherein the package comprises a heat-sink, and
   wherein the light emitting diode is mounted on the heat-sink.

* * * * *